United States Patent
Lee et al.

(10) Patent No.: US 10,790,147 B2
(45) Date of Patent: Sep. 29, 2020

(54) METHOD OF MANUFACTURING METAL HARDMASK AND SEMICONDUCTOR DEVICE

(71) Applicant: Samsung Electronics Co., Ltd., Suwon-si, Gyeonggi-do (KR)

(72) Inventors: Jang-Hee Lee, Yongin-si (KR); Se-Ran Oh, Hwaseong-si (KR); Hyun-Su Kim, Suwon-si (KR); Ik-Soo Kim, Yongin-si (KR); Seong-Gil Park, Suwon-si (KR); Geun-O Jeong, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 219 days.

(21) Appl. No.: 15/960,583

(22) Filed: Apr. 24, 2018

(65) Prior Publication Data
US 2019/0080908 A1    Mar. 14, 2019

(30) Foreign Application Priority Data
Sep. 12, 2017 (KR) .................. 10-2017-0116661

(51) Int. Cl.
| H01L 21/033 | (2006.01) |
| H01L 21/3213 | (2006.01) |
| H01L 21/3205 | (2006.01) |
| H01L 21/3215 | (2006.01) |

(52) U.S. Cl.
CPC ...... *H01L 21/0337* (2013.01); *H01L 21/0332* (2013.01); *H01L 21/3215* (2013.01); *H01L 21/32051* (2013.01); *H01L 21/32133* (2013.01)

(58) Field of Classification Search
None
See application file for complete search history.

(56) References Cited

U.S. PATENT DOCUMENTS

| 5,413,684 A | * | 5/1995 | Bergmann ........... C23C 14/0021 |
| | | | 204/192.12 |
| 5,719,410 A | * | 2/1998 | Suehiro ............. H01L 21/28061 |
| | | | 257/750 |
| 6,468,898 B1 | | 10/2002 | Usami |
| 6,939,794 B2 | | 9/2005 | Yin et al. |
| 8,906,810 B2 | | 12/2014 | Indrakanti et al. |
| 2007/0080388 A1 | | 4/2007 | Inomata |

(Continued)

FOREIGN PATENT DOCUMENTS

| JP | 2013139609 | 7/2013 |
| JP | 2016066717 | 4/2016 |
| KR | 1020100024729 | 3/2010 |

OTHER PUBLICATIONS

Mayet, "Amorphous Metal Tungsten Nitride and Its Application for Micro and Nanomechanical Applications," 2016, Final Dissertation, King Abdullah University of Science and technology, total pp. 154 (Year: 2016).*

*Primary Examiner* — Bo B Jang
(74) *Attorney, Agent, or Firm* — Myers Bigel, P.A.

(57) ABSTRACT

A method of manufacturing a semiconductor device includes forming an etch target layer on a substrate; forming an amorphous metal layer on the etch target layer, the amorphous metal layer comprising nitrogen between 15 atomic percentage (at %) and 25 at %; forming an amorphous metal hardmask by patterning the amorphous metal layer; and etching the etch target layer by using the amorphous metal hardmask as an etching mask.

19 Claims, 13 Drawing Sheets

(56) References Cited

U.S. PATENT DOCUMENTS

2015/0004803 A1   1/2015   Yamasaki et al.
2016/0284541 A1   9/2016   Shaikh et al.
2017/0287727 A1  10/2017   Kikuchi et al.

* cited by examiner

METHOD OF MANUFACTURING METAL HARDMASK AND SEMICONDUCTOR DEVICE

CROSS-REFERENCE TO RELATED APPLICATION

This application claims the benefit of Korean Patent Application No. 10-2017-0116661, filed on Sep. 12, 2017, in the Korean Intellectual Property Office, the disclosure of which is incorporated herein in its entirety by reference.

BACKGROUND

The inventive concept relates to a method of manufacturing a metal hardmask and a semiconductor device, and, more particularly, to a method of manufacturing a semiconductor device, wherein the method includes forming a hole pattern with a high aspect ratio on an etch target layer by using a metal hardmask having a high etch selectivity.

Due to developments in the electronics industry and needs of users, electrical devices are being made smaller and more lightweight. As a result, there is increased demand for semiconductor devices with high integration, which may be used in electrical devices, such that a design rule with respect to configurations of the semiconductor device may be decreased. When a highly-integrated semiconductor device is manufactured, a process of forming a hole pattern with a high aspect ratio on an etch target layer by using a metal hardmask having a high etch selectivity is performed, and during the process, undesired distortions may occur in the hole pattern due to a grain boundary in the metal hardmask.

SUMMARY

Some embodiments of the inventive concept may provide a method of manufacturing a semiconductor device, in which undesired distortions at a hole pattern may be reduced in a process of forming the hole pattern with a high aspect ratio on an etch target layer by using a metal hardmask having a relatively high etch selectivity.

Some embodiments of the inventive concept may provide a method of manufacturing a metal hardmask having openings with less distortion by forming a metal layer with a generally uniform etching characteristic.

According to some embodiments of the inventive concept, a method of manufacturing a semiconductor device includes forming an etch target layer on a substrate; forming an amorphous metal layer on the etch target layer, the amorphous metal layer including nitrogen between 15 atomic percentage (at %) and 25 at %; forming an amorphous metal hardmask by patterning the amorphous metal layer; and etching the etch target layer by using the amorphous metal hardmask as an etching mask.

According to other embodiments of the inventive concept, a method of manufacturing a semiconductor device includes forming an etch target layer on a substrate; leading the substrate into a process chamber of a sputtering device; applying an alternating current bias and direct current power to the process chamber; generating plasma by supplying an inert gas and a nitrogen gas to the process chamber; forming an amorphous metal layer on the etch target layer, the amorphous metal layer including nitrogen; discharging the substrate out of the process chamber; forming an amorphous metal hardmask by patterning the amorphous metal layer; and etching the etch target layer by using the amorphous metal hardmask as an etching mask.

According to further embodiments of the inventive concept, a method of manufacturing a metal hardmask includes forming an amorphous metal layer including nitrogen between 15 at % and 25 at %; forming a photoresist pattern on the amorphous metal layer; forming an amorphous metal hardmask including a plurality of hole patterns, where forming the amorphous metal hardmask comprises etching the amorphous metal layer by using the photoresist pattern as an etching mask; and removing the photoresist pattern.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

The inventive concept will now be described more fully with reference to the accompanying drawings, in which embodiments of the inventive concept are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Like reference numbers signify like elements throughout the description of the figures.

Some embodiments stem from a realization that when manufacturing a highly-integrated semiconductor device with a relatively high aspect ratio, when forming a hole pattern on an etch target layer using a metal hardmask undesired distortions may occur in the hole pattern due to a grain boundary in the metal hardmask. According to some embodiments of the inventive concept, an amorphous metal layer may be patterned to form an amorphous metal hardmask. The hardmask may then be used to etch a target layer. In some embodiments, the amorphous metal layer has a nitrogen content between about 15 atomic percentage (at %) and about 25 at %. In other embodiments, defects may be generated in the amorphous metal layer that is used to form the amorphous metal hardmask. The defects may be generated by generating a plasma based on an inert gas and nitrogen gas. An alternating current bias and direct current power may be applied to the process chamber containing the amorphous metal layer and an ion bombardment may be performed on the amorphous metal layer to generate the defects.

Figure 1:
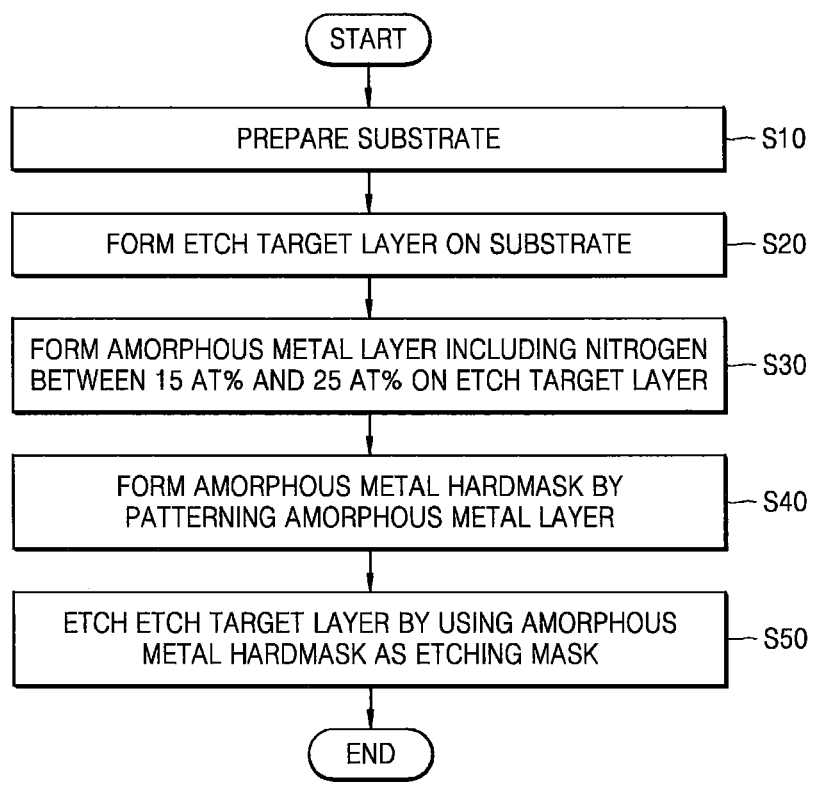
FIG. 1 is a flowchart illustrating a method of manufacturing a semiconductor device, according to some embodiments of the inventive concept.

FIG. 1 is a flowchart illustrating a method of manufacturing a semiconductor device, according to some embodiments of the inventive concept.

Referring to FIG. 1, the method of manufacturing a semiconductor device includes a first operation (S10) of preparing a substrate, a second operation (S20) of forming an etch target layer on the substrate, a third operation (S30) of forming, on the etch target layer, an amorphous metal layer including nitrogen between about 15 atomic percentage (at %) and about 25 at %, a fourth operation (S40) of forming an amorphous metal hardmask by patterning the amorphous metal layer, and a fifth operation (S50) of etching the etch target layer by using the amorphous metal hardmask as an etching mask.

A design rule with respect to configurations of a semiconductor device may be decreased as devices become more highly-integrated. When a highly-integrated semiconductor device is manufactured, a process of forming a hole pattern with a high aspect ratio on an etch target layer by using a metal hardmask having a high etch selectivity is performed, and during the process, undesired distortions may occur in the hole pattern due to a grain boundary in the metal hardmask.

To address such problems, embodiments of the inventive concept may provide a method of manufacturing a semiconductor device involving using an amorphous metal layer including nitrogen between about 15 at % and about 25 at % as a hardmask. The first operation (S10) through the fifth operation (S50) of a method of manufacturing a semiconductor device, according to some embodiments of the inventive concept, will be described in detail with reference to FIGS. 5A through 5H.

Figure 2:
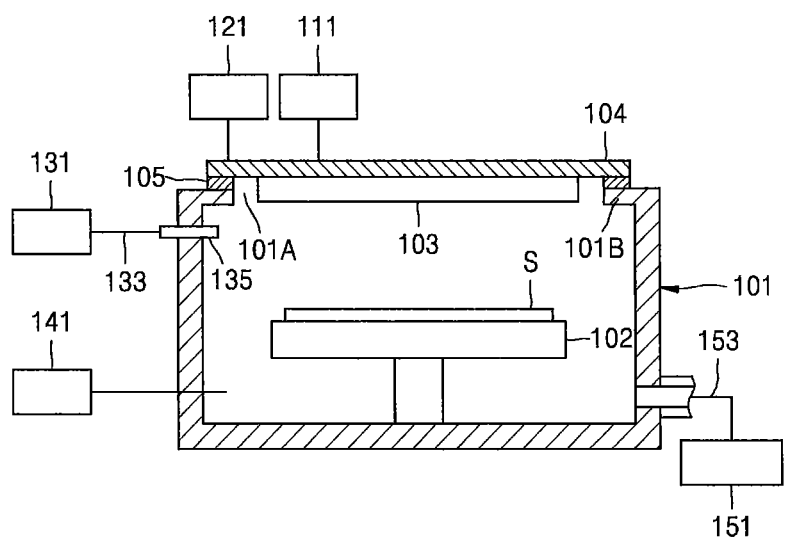
FIG. 2 is a cross-sectional view of a process chamber that may be used in performing a method of manufacturing a semiconductor device, according to some embodiments of the inventive concept.

FIG. 2 is a cross-sectional view of a process chamber 101 that may be used in performing a method of manufacturing a semiconductor device, according to some embodiments of the inventive concept.

FIG. 2 is the cross-sectional view of a configuration of the process chamber 101 in a sputtering device of a semiconductor manufacturing apparatus.

To form a metal layer, various thin-film forming techniques may be used. However, the metal layer may be crystallized when overheated during a thin-film forming process; therefore, a physical vapor deposition (PVD) method performed at a relatively low process temperature, compared to that of another thin-film forming technique (e.g., chemical vapor deposition (CVD)), may be used.

The PVD method may include, but is not limited to, a direct current (DC) sputtering method, a radio frequency (RF) sputtering method, a magnetron sputtering method, a bias sputtering method, a reactive sputtering method, a long throw sputtering (LTS) method to increase straightness, a collimated sputtering method, or the like.

The cross-sectional view of the process chamber 101 is illustrated in the sputtering device according to some embodiments of the inventive concept. The sputtering device includes the process chamber 101. A loading member 102 to load a substrate S, e.g., a semiconductor wafer, is mounted in the process chamber 101. A top portion of the process chamber 101 may have an open region 101A, and a lid 101B having a generally round shape viewed from above is arranged at the top portion of the process chamber 101. A conductive target-supporting member 104 is formed over the lid 101B via an insulating member 105 so as to cover the open region 101A, and a target 103 having composition of a desired metal layer is placed at a bottom surface of the target-supporting member 104.

A direct current (DC) power source 111 may be connected to the target-supporting member 104, and a DC voltage may be applied from the DC power source 111 to the target 103 via the target-supporting member 104. In addition, an alternating current (AC) bias generator 121 is connected to the target-supporting member 104, and an AC bias may be applied from the AC bias generator 121 to the process chamber 101 via the target-supporting member 104.

A gas introduction nozzle 135 is inserted into the process chamber 101 via an upper side wall of the process chamber 101, and is connected to a process gas supply source 131 via a gas supply pipe 133. At least one type of process gas may be supplied from the process gas supply source 131 into the process chamber 101 via the gas supply pipe 133 and the gas introduction nozzle 135.

A controller 141 capable of detecting and adjusting a process temperature and a process pressure within the process chamber 101 is connected to a lower side wall of the process chamber 101. In addition, an exhaust pipe 153 is connected to the other lower side wall of the process chamber 101, and air within the process chamber 101 may be evacuated by a vacuum pump 151 via the exhaust pipe 153.

In the sputtering device having the aforementioned configuration, air within the process chamber 101 is evacuated by the vacuum pump 151 while the substrate S is loaded onto the loading member 102, and a process gas is supplied from the process gas supply source 131 into the process chamber 101, such that the inside of the process chamber 101 becomes a vacuum atmosphere. In such a state, the DC voltage is applied from the DC power source 111 to the target 103, and the AC bias is applied from the AC bias generator 121 into the process chamber 101.

The process gas is ionized by an electric field due to the applied DC voltage and AC bias, thereby generating electrons, and the electrons drift responsive to the electric field to generate plasma. Process ions in the plasma apply physical power to the target 103 to form sputtered metal particles, and then the sputtered metal particles are deposited on the substrate S to form the metal layer.

Tables 1 through 4 show results of tests to form the amorphous metal layer according to the inventive concept.

TABLE 1

|    | 100 | 200 | 300 | 400 | 500 |
|----|-----|-----|-----|-----|-----|
| 10 | X   | X   | X   | X   | X   |
| 20 | X   | O   | O   | X   | X   |
| 30 | X   | O   | O   | X   | X   |
| 40 | X   | X   | X   | X   | X   |
| 50 | X   | X   | X   | X   | X   |

TABLE 2

|    | 100 | 200 | 300 | 400 | 500 |
|----|-----|-----|-----|-----|-----|
| 10 | X   | X   | X   | X   | X   |
| 20 | X   | X   | X   | X   | X   |
| 30 | X   | O   | O   | O   | X   |
| 40 | X   | O   | O   | O   | X   |
| 50 | X   | X   | X   | X   | X   |

TABLE 3

|    | 100 | 200 | 300 | 400 | 500 |
|----|-----|-----|-----|-----|-----|
| 10 | X   | X   | X   | X   | X   |
| 20 | X   | X   | X   | X   | X   |
| 30 | X   | X   | X   | X   | X   |
| 40 | X   | O   | O   | O   | X   |
| 50 | X   | O   | O   | O   | X   |

TABLE 4

|    | 100 | 200 | 300 | 400 | 500 |
|----|-----|-----|-----|-----|-----|
| 10 | X   | X   | X   | X   | X   |
| 20 | X   | X   | X   | X   | X   |
| 30 | X   | X   | X   | X   | X   |
| 40 | X   | X   | O   | O   | X   |
| 50 | X   | O   | O   | O   | X   |

In Tables 1 through 4, horizontal rows each indicate an applied AC bias (unit: W), and vertical columns each indicate a flow ratio (unit: %) of a nitrogen gas compared to an inert gas (e.g., argon) in a supplied process gas. Also, Table 1 shows an example in which an applied DC voltage is about 2 kW, Table 2 shows an example in which the applied DC voltage is about 3 kW, Table 3 shows an example in which the applied DC voltage is about 4 kW, and Table 4 shows an example in which the applied DC voltage is about 5 kW. In the example tests, a process temperature is about 100° C., and a process pressure, which may be changed depending on the flow ratio of the nitrogen gas, is between about 13 mTorr and about 20 mTorr. In some embodiments, the process temperature may be in a range from about 75° C. to about 300° C.

That is, the example tests were performed with respect to conditions by which the amorphous metal layer is formed while DC power, the AC bias, and the flow ratio of the nitrogen gas are changed, and in the results of the example tests, a test specimen from which the amorphous metal layer was formed is marked O, and a test specimen from which the amorphous metal layer was not formed but a crystallized metal layer was partly formed is marked X. A composition of the amorphous metal layer according to some embodiments of the inventive concept is illustrated below with reference to FIG. 4.

As a result, in to form the amorphous metal layer according to embodiments of the inventive concept, DC power between about 2 kW and about 5 kW and an AC bias between about 150 W and about 400 W were applied to the process chamber 101, such that an ion bombardment occurs within the process chamber 101 and, thus, defects were formed in the metal layer.

It will be understood, however, that conditions for forming an amorphous metal layer on the substrate S in the process chamber 101 are not limited to the example test conditions described herein and that other test conditions may be used in accordance with other embodiments of the inventive concept.

Figure 3:
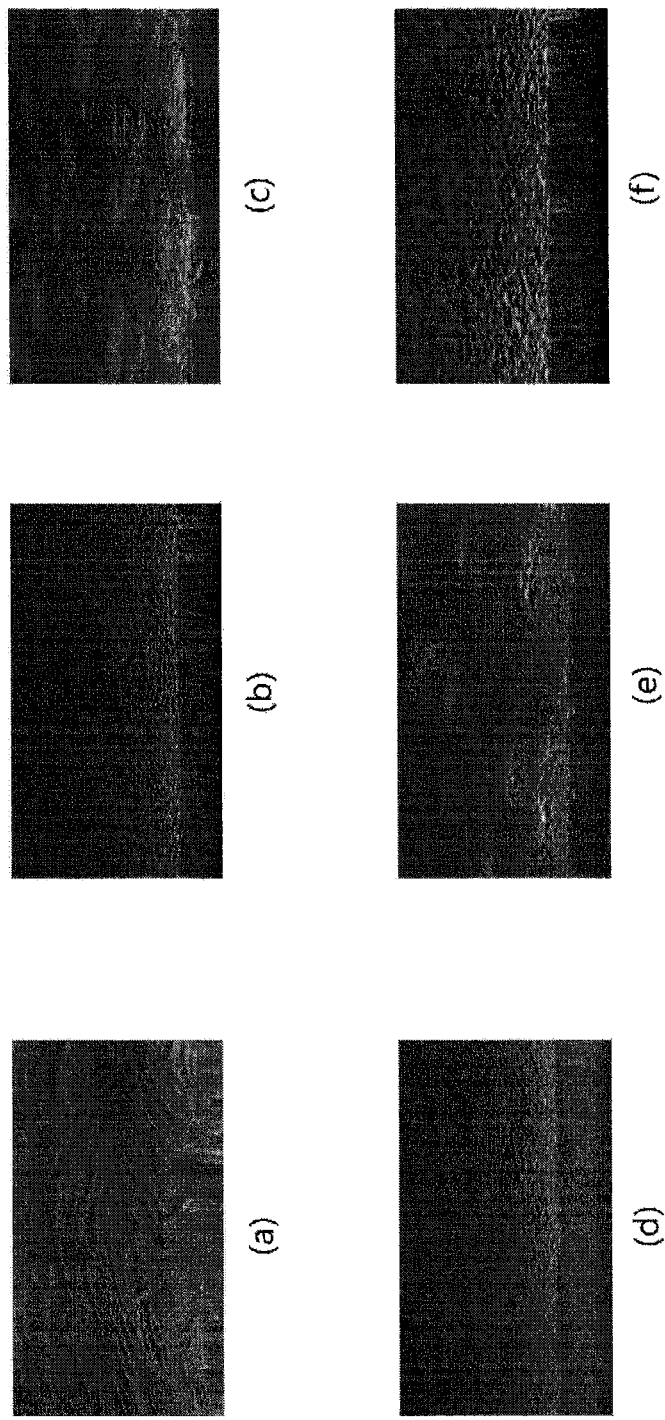
FIG. 3 shows scanning electron microscope (SEM) images used in comparing degrees of crystallization of a metal layer based on changes in composition of nitrogen included in a metal layer, according to some embodiments of the inventive concept.

FIGS. 3(*a*) through 3(*f*) correspond to scanning electron microscope (SEM) images used in comparing degrees of crystallization of a metal layer based on changes in composition of nitrogen included in the metal layer in accordance with some embodiments of the inventive concept.

Referring to FIGS. 3(*a*) through 3(*f*), specimens were made by using the sputtering device and the method described above with reference to FIG. 2 to compare degrees of crystallization of a metal layer based on changes in composition of nitrogen. Tungsten targets not including nitrogen were used as a target, and the changes in composition of nitrogen included in the metal layer were obtained by adjusting a proportion of a nitrogen gas in a process gas.

Referring to FIG. 3(*a*), the SEM image shows a specimen in which a proportion of nitrogen in a tungsten thin-film is about 0%. By performing an image analysis and a component analysis, it was possible to check that tungsten in the thin-film was in a crystalline state.

Referring to FIG. 3(*b*), the SEM image shows a specimen in which the proportion of nitrogen in a tungsten thin-film is about 4.8%. By performing the image analysis and the component analysis, it was possible to check that tungsten in the thin-film was in a crystalline state. Even if a degree of crystallization is decreased compared to that of FIG. 3(*a*), it is apparent that the thin-film was not formed as an amorphous metal layer.

Referring to FIG. 3(*c*), the SEM image shows a specimen in which the proportion of nitrogen in a tungsten thin-film is about 10%. By performing the image analysis and the component analysis, it was possible to check that tungsten in the thin-film was in both a crystalline state and an amorphous state.

Referring to FIG. 3(*d*), the SEM image shows a specimen in which the proportion of nitrogen in a tungsten thin-film is about 20.9%. By performing the image analysis and the component analysis, it was possible to check that tungsten in the thin-film was in an amorphous state.

Referring to FIG. 3(*e*), the SEM image shows a specimen in which the proportion of nitrogen in a tungsten thin-film was about 31.2%. By performing the image analysis and the component analysis, it was possible to check that a tungsten nitride layer in the thin-film was in both a crystalline state and an amorphous state.

Referring to FIG. 3(f), the SEM image shows a specimen in which the proportion of nitrogen in a tungsten thin-film was about 38.9%. By performing the image analysis and the component analysis, it was possible to check that a tungsten nitride layer in the thin-film was in a crystalline state.

As shown in the SEM images, the specimens varied according to the tungsten thin-film having the crystalline state, the tungsten thin-film having both the crystalline state and the amorphous state, the amorphous tungsten thin-film doped with nitrogen, the tungsten nitride layer having both the crystalline state and the amorphous state, and the tungsten nitride layer having the crystalline state based on the changes in composition of nitrogen included in the metal layer.

It is possible to see that the composition of nitrogen in the metal layer may range between about 15 at % and about 25 at % so as to form the amorphous metal layer according to embodiments of the inventive concept. Also, it is possible to see that, in other nitrogen composition ranges, the metal layer was formed having the crystalline state or having both the crystalline state and the amorphous state.

When the composition of nitrogen ranges between about 15 at % and about 25 at %, the composition of nitrogen does not reach a composition ratio of the tungsten nitride layer (tungsten:nitrogen=2:1) by which crystallization may be achieved, thus, the tungsten nitride layer may not be crystallized. However, because a covalent bond between tungsten and nitrogen may occur in a process of forming the tungsten thin-film, an amorphous state of a final metal layer may be maintained by interfering with regular arrangement of tungsten elements by applying an AC bias between about 150 W and about 400 W to the tungsten thin-film.

Figure 4:
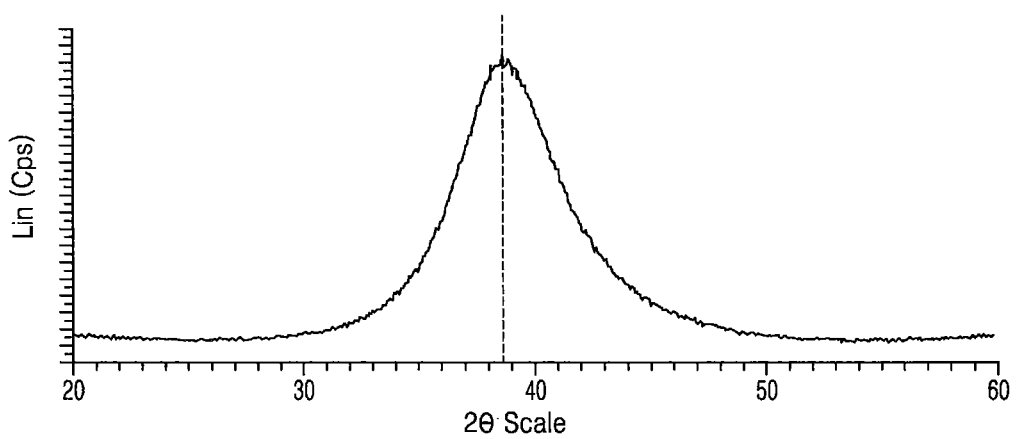
FIG. 4 is a graph of an X-ray diffraction (XRD) spectrum of an amorphous metal layer manufactured by using a method of manufacturing a semiconductor device according to some embodiments of the inventive concept.

FIG. 4 is a graph of an X-ray diffraction (XRD) spectrum of the amorphous metal layer manufactured by using manufacturing methods of a semiconductor device according to some embodiments of the inventive concept.

Referring to FIG. 4, in a 2θ scale XRD spectrum of a metal layer including nitrogen of about 20.9 at %, a maximum value of a diffraction peak is achieved when a 2θ value is about 39 degrees.

The amorphous metal layer according to some embodiments of the inventive concept may be a metal layer that does not have clear crystallization. Even if very small crystallization is present in a portion of the metal layer, the metal layer is considered to be included in the amorphous metal layer according to some embodiments of the inventive concept. In more detail, in the 2θ scale XRD spectrum of FIG. 4, irrespective of the existence of a diffraction peak of an element, a width of the peak is large, which cannot belong to any element; therefore, a metal layer thereof is considered to be included in the amorphous metal layer according to some embodiments of the inventive concept.

The metal layer including nitrogen of about 20.9 at % corresponds to a case in which, in the 2θ scale XRD spectrum, the maximum value of the diffraction peak is achieved when the 2θ value is about 39 degrees, and a peak of the metal layer (a spectrum called a Halo peak which is generally shown as an amorphous characteristic) is large in which the 2θ value is realized at between about 30 degrees and about 50 degrees. Thus, the metal layer may be determined to have an amorphous state.

FIGS. 5A through 5H are cross-sectional views that illustrate methods of manufacturing a semiconductor device, according to some embodiments of the inventive concept.

Figure 5A:
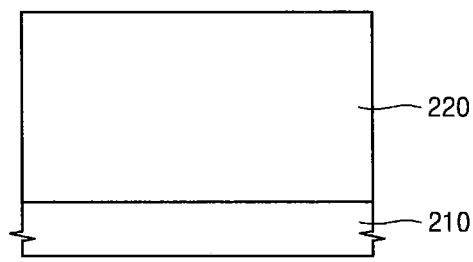
FIGS. 5A through 5H are cross-sectional views illustrating a method of manufacturing a semiconductor device, according to some embodiments of the inventive concept.

Referring to FIG. 5A, a substrate 210 on which an etch target layer 220 is formed is prepared.

The substrate 210 may include silicon (Si), for example, crystalline silicon (Si), polycrystalline silicon (Si), amorphous silicon (Si), or combinations thereof. In other embodiments, the substrate 210 may include a compound semiconductor including germanium (Ge), silicon germanium (SiGe), silicon carbide (SiC); gallium arsenide (GaAs), indium arsenide (InAs), indium phosphide (InP) or combinations thereof. In some embodiments, the substrate 210 may include a conductive region, for example, a well doped region with impurities or a structure doped with impurities, and may include a semiconductor integrated circuit. The semiconductor integrated circuit may include at least one of a transistor, a diode, a capacitor, and a resistor.

The etch target layer 220 may be an insulating material layer, a conductive material layer, a semiconductor material layer, or combinations thereof. When the etch target layer 220 is the insulating material layer, the etch target layer 220 may have a single-layer structure in which a silicon oxide layer or a silicon nitride layer is singularly formed, or may have a multilayer structure in which the silicon oxide layer and the silicon nitride layer are alternately stacked.

Figure 5B:
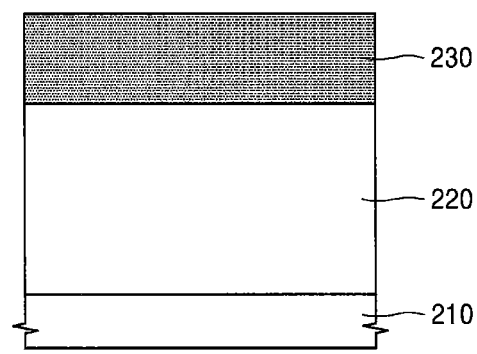

Referring to FIG. 5B, an amorphous metal layer 230 including nitrogen between about 15 at % and about 25 at % may be formed on the etch target layer 220.

The amorphous metal layer 230 may include a material selected from among materials whose etch selectivity is high with respect to the etch target layer 220, i.e., the materials having a high etch selectivity. For example, a metal and/or a metallic material may be used.

In some embodiments, the amorphous metal layer 230 may include at least one metal selected from among tungsten (W), titanium (Ti), tantalum (Ta), manganese (Mn), molybdenum (Mo), cobalt (Co), copper (Cu), nickel (Ni), iron (Fe), and/or ruthenium (Ru). In some embodiments, the amorphous metal layer 230 includes tungsten.

Figure 5C:
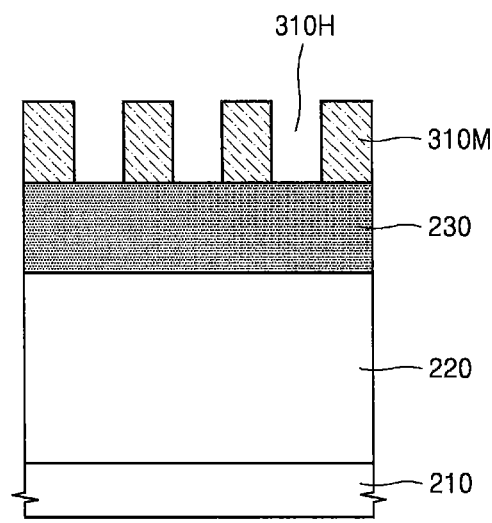
Figure 5D:
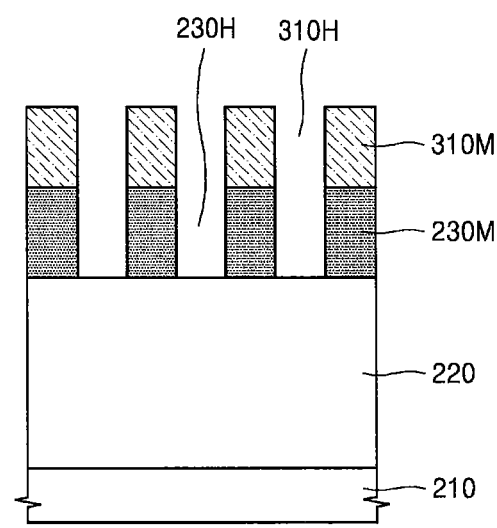

The amorphous metal layer 230 is a base material layer used in forming an amorphous metal hardmask 230M (refer to FIG. 5D). Because a hardmask may have a transfer capability for transferring a mask pattern to an etch target layer without distortions, a material appropriate for forming a pattern may be used.

In general, when a metal layer is used as the hardmask, if etching is not uniformly performed due to a grain boundary of metal, a distortion may occur at a hole pattern formed at the metal layer, such that uniformity between neighboring holes may not be assured. Also, in a following process where the etch target layer is etched by using the hardmask as an etching mask, a profile of the hole pattern may be tilted.

The inventive concept may provide a method of forming the amorphous metal layer 230 as the metal layer used as a hardmask. In this case, etching irregularities that may occur due to a grain boundary may be reduced in the amorphous metal layer 230, so that the hole pattern may have improved stability.

The amorphous metal layer 230 may be formed by using the aforementioned device and method embodiments, and, thus, for convenience of description, detailed descriptions thereof are omitted here.

Referring to FIG. 5C, a photoresist pattern 310M having first openings 310H is formed on the amorphous metal layer 230.

Although not illustrated, an anti-reflection layer may be formed between the amorphous metal layer 230 and the photoresist pattern 310M. The anti-reflection layer may include an inorganic anti-reflection layer, an organic anti-reflection layer, or a combination thereof.

The photoresist pattern 310M may be formed as a hole pattern, a square pattern, a line and space pattern, or the like. In some embodiments, the photoresist pattern 310 has the first openings 310H formed at regular intervals, but embodiments of the inventive concept are not limited thereto. For example, the photoresist pattern 310M may have various patterns, such as a straight-line type pattern, a curved-line type pattern, a zigzag type pattern, or the like, and may have a width varying along a longitudinal direction.

Referring to FIG. 5D, an amorphous metal hardmask 230M having second openings 230H is formed by etching the exposed amorphous metal layer 230 (refer to FIG. 5C), such that a top surface of the etch target layer 220 is exposed.

The amorphous metal hardmask 230M is formed by etching the amorphous metal layer 230 (refer to FIG. 5C) exposed via the first openings 310H of the photoresist pattern 310M. As described above, the amorphous metal layer 230 (refer to FIG. 5C) does not include the grain boundary. As a result, the possibility that distortions due to the grain boundary may occur among the second openings 230H is relatively low as compared to a metal layer including the grain boundary. That is, a form of the first openings 310H of the photoresist pattern 310M may be transferred as a form of the second openings 230H of the amorphous metal hardmask 230M substantially without distortions. Accordingly, a deformation, such as a merger between the neighboring second openings 23011 may be less likely to occur at the hole pattern, so that the hole pattern may be embodied with improved stability.

Figure 5E:
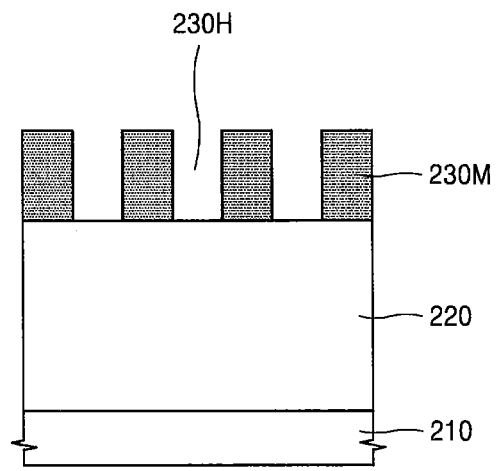

Referring to FIG. 5E, the photoresist pattern 310M (refer to FIG. 5D) is removed.

The photoresist pattern 310M (refer to FIG. 5D) may be removed by using an ashing and stripping process. The process of removing the photoresist pattern 310M (refer to FIG. 5D) may be performed under a condition to reduce any influence on the amorphous metal hardmask 230M.

By doing so, the amorphous metal hardmask 230M including the second openings 230H may be formed on the etch target layer 220. A top-plan view of the second openings 230H will now be described below.

Figure 5F:
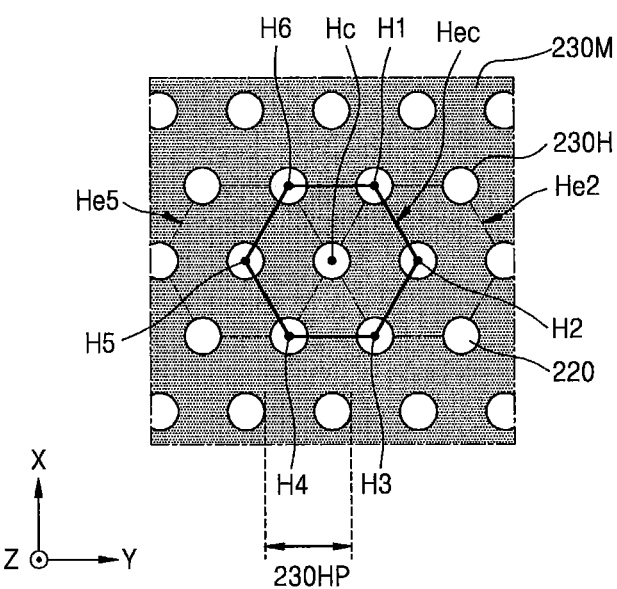

Referring to FIG. 5F, in the top-plan view, the second openings 230H of the amorphous metal hardmask 230M may be arranged in a honeycomb structure.

The honeycomb structure may be a structure in which the second openings 230H are arranged at vertexes H1, H2, H3, H4, H5 and H6 and a center point Hc of a hexagon. The second openings 230H may be arranged in honeycomb structures that continue while overlapping each other in a first direction (i.e., an X-axis direction) and a second direction (i.e., a Y-axis direction).

In more detail, the second openings 230H may be arranged in a manner that six vertexes H1, H2, H3, H4, H5 and H6 of a central hexagon Hec (shown using a solid line) respectively correspond to center points of six neighboring hexagons, and a center point He of the central hexagon Hec may be shared among the six hexagons. For example, a second vertex 112 may correspond to a center point of a second hexagon He2 (shown using an alternated long-and-short dash line), a fifth vertex H5 may correspond to a center point of a fifth hexagon He5 (shown using a broken line), and the center point Hc of the central hexagon Hec may be shared as one of six vertexes of each of the second hexagon He2 and the fifth hexagon He5.

In the honeycomb structure of the second openings 230H, the hexagons may be regular hexagons. Also, all six triangles sharing the center point He may be regular triangles. Accordingly, distances between neighboring vertexes or between vertexes and a center point in one hexagon may be equal.

In this manner, because the second openings 230H are arranged in the honeycomb structure, the second openings 230H may have generally uniform pitches 230HP, such that the second openings 230H may form generally uniform third openings 220H (refer to FIG. 5G) on the etch target layer 220 in a following process and, thus, may contribute to the manufacture of a semiconductor device having improved reliability. However, an arrangement of the second openings 230H is not limited to the arrangement in the top-plan view in accordance with various embodiments of the inventive concept.

Figure 5G:
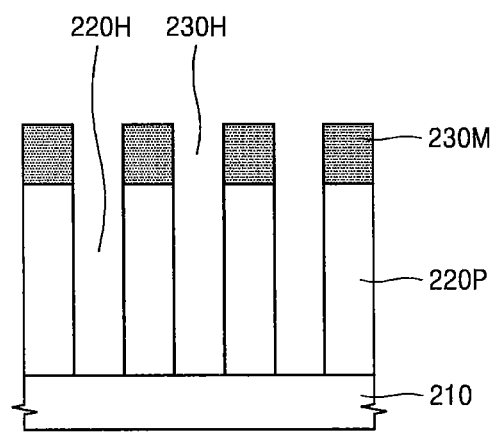
Figure 5H:
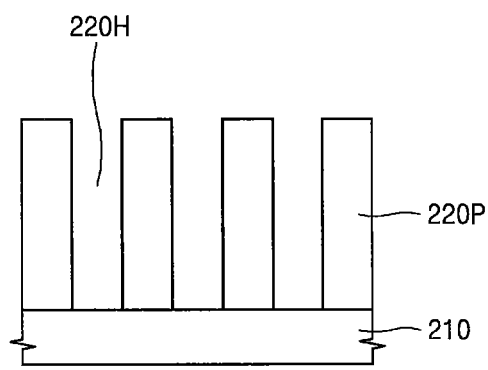

Referring to FIG. 5G, after unnecessary layers (e.g., the anti-reflection layer) over the amorphous metal layer 230 are removed, the etch target layer 220 (refer to FIG. 5E) is etched by using the amorphous metal hardmask 230M as an etching mask, such that an etch target pattern 220P having the third openings 220H exposing a top surface of the substrate 210 is formed.

In some embodiments, the etch target pattern 220P may be formed while not exposing the top surface of the substrate 210. As described above, the amorphous metal layer 230 (refer to FIG. 5B) may include a material selected from among materials whose etch selectivity is high with respect to the etch target layer 220 (refer to FIG. 5E), i.e., materials having a high etch selectivity. Also, the etch target pattern 220P may include the third openings 22014 each having a high aspect ratio.

When a highly-integrated semiconductor device is manufactured, in a process where the etch target pattern 220P is formed to have the third openings' 220H with a high density like the aforementioned honeycomb structure, the hole pattern may be formed while undesired distortions at the third openings 220H are reduced or minimized by using the amorphous metal hardmask 230M according to some embodiments of the inventive concept.

Referring to FIG. 514, a predetermined hole pattern is formed by removing the amorphous metal hardmask 230M (refer to FIG. 5G) remaining on the etch target pattern 220P.

In some embodiments, the amorphous metal hardmask 230M (refer to FIG. 5G) may not be removed. The etch target pattern 220P may be formed as various patterns, such as an insulation pattern, a metal pattern, a semiconductor pattern, or the like according to materials forming the etch target pattern 220P. A subsequent semiconductor device manufacturing process may be performed by using the completed etch target pattern 220P.

In this manner, according to some embodiments of the inventive concept, a minute pattern of a highly-integrated semiconductor device may be embodied by using an amorphous metal hardmask that is configured to reduce distortions of a hole pattern, such that reliability and productivity with respect to the semiconductor device may be improved.

Figure 6A:
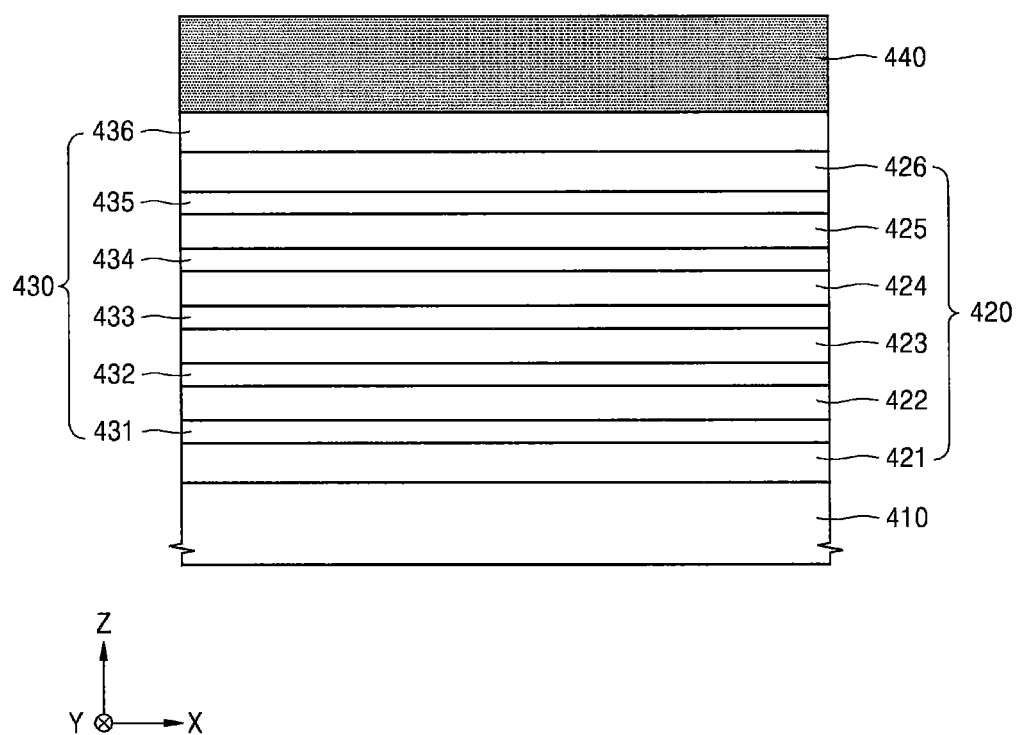
FIGS. 6A and 6B are cross-sectional views illustrating a method of manufacturing a hole pattern for forming channels of a vertical-type memory device by using a method of manufacturing a semiconductor device, according to some embodiments of the inventive concept.
Figure 6B:
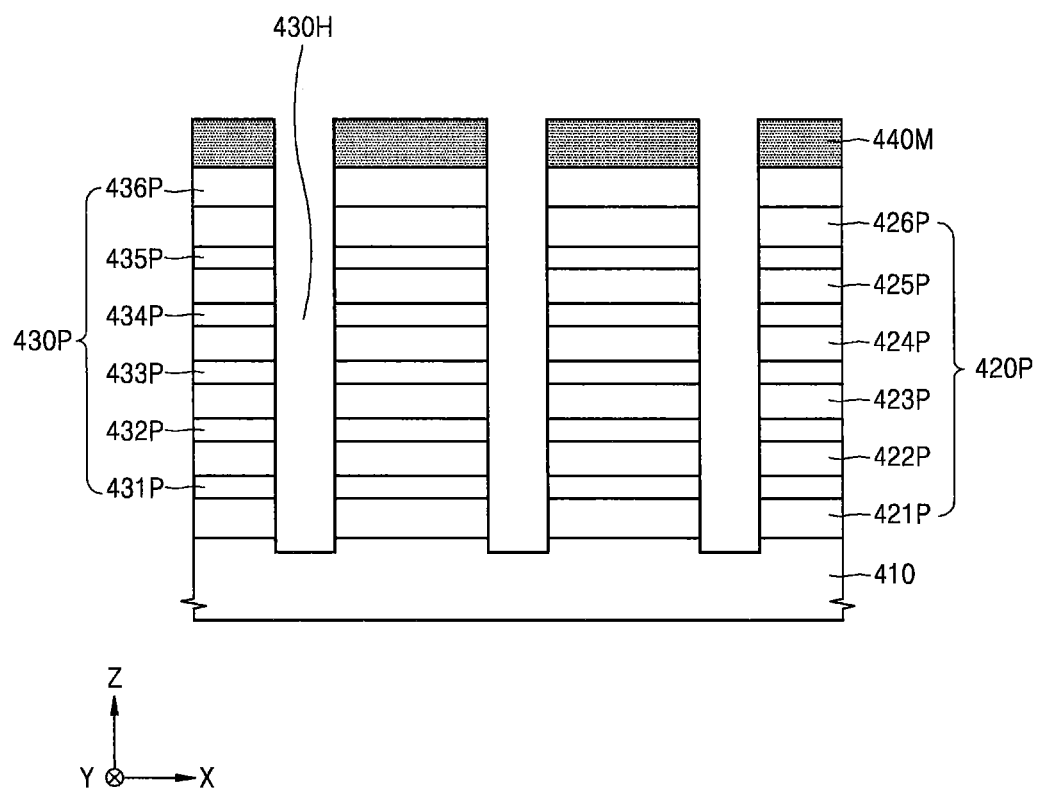

FIGS. 6A and 6B are cross-sectional views that illustrate a method of manufacturing a hole pattern for forming channels of a vertical-type memory device, by using methods of manufacturing a semiconductor device, according to some embodiments of the inventive concept.

Referring to FIG. 6A, sacrificial layers 420 and interlayer dielectric layers 430 are alternately stacked on a substrate 410, and an amorphous metal layer 440 is formed on the uppermost interlayer dielectric layer 430.

The substrate 410 is substantially similar to that described above with reference to FIG. 5A, thus, a detailed description thereof is omitted here. In some embodiments, a lower structure (not shown) including at least one transistor may be placed between the substrate 410 and the sacrificial layers 420. However, for convenience of description, an embodiment is illustrated, in which the sacrificial layers 420 and the interlayer dielectric layers 430 are directly formed on the substrate 410.

The sacrificial layers 420 may include a plurality of sacrificial layers 421 through 426 (also referred to as the first through sixth sacrificial layers 421 through 426), the interlayer dielectric layers 430 may include a plurality of dielectric layers 431 through 436 (also referred to as the first through sixth interlayer dielectric layers 431 through 436), and, the first through sixth sacrificial layers 421 through 426 and the first through sixth interlayer dielectric layers 431 through 436 may be alternately stacked on the substrate 410 having the first sacrificial layer 421 as a lowermost layer. The sacrificial layers 420 may include a material to be etched with an etch selectivity with respect to the interlayer dielectric layers 430. That is, in a process of etching the sacrificial layers 420 by using a predetermined etching recipe, the sacrificial layers 420 may be formed of a material to be etched allowing the interlayer dielectric layers 430 to be slightly or minimally etched. The etch selectivity may be quantitatively expressed by a ratio of an etch rate of the sacrificial layers 420 to an etch rate of the interlayer dielectric layers 430.

In some embodiments, the sacrificial layers 420 may include one or more materials each having an etch selectivity ranging between about 1:10 and about 1:200 with respect to the interlayer dielectric layers 430. For example, the interlayer dielectric layers 430 may each be at least one of a silicon oxide layer and a silicon nitride layer, or a combination thereof. The sacrificial layers 420 may each be at least one of a silicon layer, a silicon oxide layer, a silicon carbide layer, and a silicon nitride layer, or a combination thereof, and may include a material different from the interlayer dielectric layers 430.

In some embodiments, the first sacrificial layer 421 and the sixth sacrificial layer 426 may each be formed to be thicker than each of the second through fifth sacrificial layers 422 through 425. Thicknesses of the first sacrificial layer 421 and the sixth sacrificial layer 426, respectively, determine thicknesses of gates of a string selecting transistor and a ground selecting transistor, and to supply sufficient current to a memory cell string, the thicknesses of the gates may be greater than a gate of a memory cell whose thickness is determined based on thicknesses of the second through fifth sacrificial layers 422 through 425.

The thicknesses of the sacrificial layers 420 and thicknesses of the interlayer dielectric layers 430 may be changed in accordance with various embodiments of the inventive concept, and the number of layers included in the sacrificial layers 420 and the interlayer dielectric layers 430 may also vary.

An amorphous metal layer 440 including nitrogen between about 15 at % and about 25 at % may be formed on the sixth interlayer dielectric layer 436 that is the uppermost layer from among the interlayer dielectric layers 430. A method of forming the amorphous metal layer 440 is substantially similar to that described above with reference to FIG. 5B, thus, a detailed description thereof are omitted here.

Referring to FIG. 6B, sacrificial patterns 420P and interlayer dielectric patterns 430P, which include fourth openings, 430H may be alternately stacked by using an amorphous metal hardmask 440M as an etching mask.

The fourth openings 430H may define semiconductor regions and a region in which dielectric layers are formed. The fourth openings 430H may each be a trench having a depth in a third direction (i.e., a Z-axis direction) and extending in a second direction (i.e., a Y-axis direction). Also, the fourth openings 430H may be repeatedly formed by having a predetermined distance therebetween in a first direction (i.e., an X-axis direction).

To form the fourth openings 430H, anisotropic etching may be performed on the sacrificial layers 420 (refer to FIG. 6A) and the interlayer dielectric layers 430 (refer to FIG. 6A) by using the amorphous metal hardmask 440M as the etching mask, wherein the amorphous metal hardmask 440M defines positions of the fourth openings 430H on the sacrificial layers 420 (refer to FIG. 6A) and the interlayer dielectric layers 430 (refer to FIG. 6A), which are alternately stacked.

The amorphous metal hardmask 440M may be formed by patterning the amorphous metal layer 440 (refer to FIG. 6A) by using operations described with reference to FIGS. 5C through 5E. The forming of the fourth openings 430H used as the hole pattern for forming channels of a vertical-type memory device corresponds to the forming of a hole pattern having a relatively high aspect ratio, thus, distortions of the hole pattern may be reduced or minimized by using the amorphous metal hardmask 440M according to some embodiments of the inventive concept.

In some embodiments, the fourth openings 430H penetrating through the sacrificial patterns 420P and the interlayer dielectric patterns 430P may be formed to expose a portion of a top surface of the substrate 410 as illustrated. In addition, as illustrated, the substrate 410 below the fourth openings 430H may be recessed to a predetermined depth as a result of an over-etch in the anisotropic etching.

After the aforementioned process is performed, the amorphous metal hardmask 440M may be removed. Although not illustrated, after the fourth openings 430H are formed, a channel structure may be formed in the fourth openings 430H by forming a semiconductor material layer that conformally covers side walls and bottom surfaces of the fourth openings 430H. By performing the following processes, a vertical-type memory device may be manufactured according to some embodiments of the inventive concept.

When the amorphous metal hardmask 440M according to embodiments of the inventive concept is used, the hole pattern may not be distorted nor tilted even when each of the fourth openings 430H has a relatively high aspect ratio, and, consequently, reliability and productivity with respect to the vertical-type memory device may be increased.

Figure 7A:
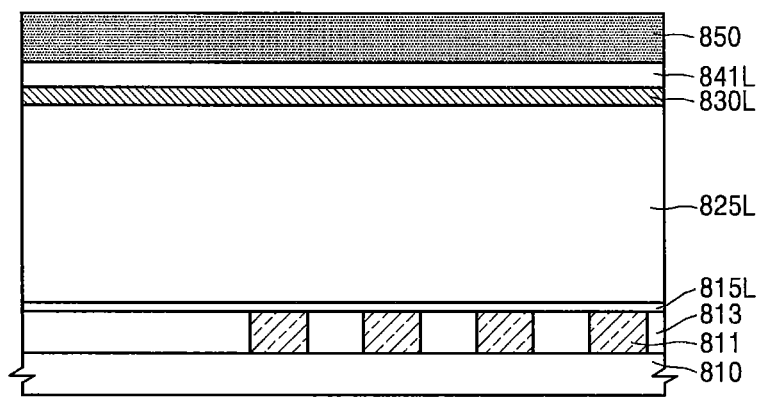
FIGS. 7A and 7B are cross-sectional views illustrating a method of manufacturing a hole pattern for forming a cylinder-type capacitor of a memory device by using a method of manufacturing a semiconductor device, according to some embodiments of the inventive concept.
Figure 7B:
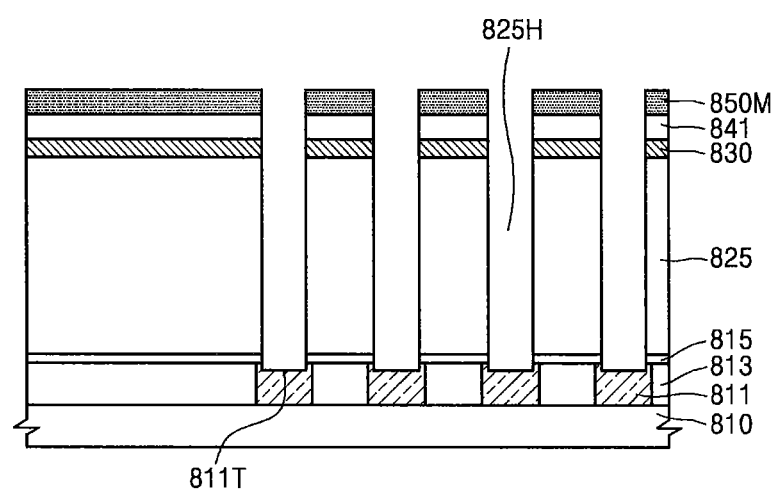

FIGS. 7A and 7B are cross-sectional views illustrating a method of manufacturing a hole pattern for forming a cylinder-type capacitor of a memory device, by using methods of manufacturing a semiconductor device, according to some embodiments of the inventive concept.

Referring to FIG. 7A, various material layers to form the cylinder-type capacitor are formed on a semiconductor substrate 810, and then an amorphous metal layer 850 is formed on an uppermost material layer from among the various material layers.

In this regard, all layers that include an interlayer dielectric layer 813, a plurality of contact plugs 811, a mold layer 825L, or the like, and are formed below the amorphous metal layer 850, are collectively referred to as a material layer.

The mold layer 825L may include a silicon oxide layer. For example, the mold layer 825L may include a material, such as borophosphosilicate glass (BPSG), Spin on Dielectric (SOD), phosphosilicate glass (PSG), low pressure tetraethyl orthosilicate (LPTEOS), plasma enhanced tetraethyl orthosilicate (PETEOS), or the like. A thickness of the mold layer 825L may be between about 500 nm and about 4000 nm, but the thickness is not limited to the range in accordance with various embodiments of the inventive concept.

Afterward, a support forming layer 830L is formed on the mold layer 825L. In this regard, the support forming layer 830L may be a silicon nitride layer or a polysilicon layer, which forms a structure for preventing a lower electrode from falling down or collapsing during a following wet etching process.

Subsequently, a sacrificial layer 841L is formed on the support forming layer 830L. In this regard, the sacrificial layer 841L may include a material, such as TEOS, BPSG, PSG, undoped silicate glass (USG), SOD, high-density plasma (HDP) oxide, or the like.

Subsequently, the amorphous metal layer 850 including nitrogen between 15 at % and 25 at % may be formed on the sacrificial layer 841L. The forming of the amorphous metal layer 850 is substantially similar to that described above with reference to FIG. 5B, thus, detailed descriptions thereof are omitted here.

Referring to FIG. 7B, the sacrificial layer 841L (refer to FIG. 7A), the support forming layer 830L (refer to FIG. 7A), the mold layer 825L (refer to FIG. 7A), and an etch stopping layer 815L (refer to FIG. 7A) are sequentially etched by using an amorphous metal hardmask 850M as an etching mask.

During the etching process, the sacrificial layer 841L (refer to FIG. 7A) becomes a sacrificial pattern 841, the support forming layer 830L (refer to FIG. 7A) becomes a support pattern 830, the mold layer 825L (refer to FIG. 7A) becomes a mold pattern 825, and the etch stopping layer 815L (refer to FIG. 7A) becomes an etch stopping pattern 815. In addition, a plurality of fifth openings 825H are formed, and top surfaces of the contact plugs 811 may be exposed via the fifth openings 825H.

In some embodiments, grooves 811T may be formed on the top surfaces of the contact plugs 811 by performing over-etching. In other embodiments, the grooves 811T may not be formed on the top surfaces of the contact plugs 811.

The amorphous metal hardmask 850M may be formed by patterning the amorphous metal layer 850 (refer to FIG. 7A) by using operations described with reference to FIGS. 5C through 5E. The forming of the fifth openings 825H used as the hole pattern for forming a cylinder-type capacitor of a memory device corresponds to the forming of a hole pattern having a high aspect ratio, thus, distortions of the hole pattern may be reduced or minimized by using the amorphous metal hardmask 850M according to some embodiments of the inventive concept.

After the aforementioned process is performed, the amorphous metal hardmask 850M may be removed. Although not illustrated, after the fifth openings 825H are formed, a cylinder-type capacitor structure may be formed in the fifth openings 825H by forming a semiconductor material layer that conformally covers side walls and bottom surfaces of the fifth openings 825H. By performing the following processes, the memory device may be manufactured according to some embodiments of the inventive concept.

When the amorphous metal hardmask 850M according to some embodiments of the inventive concept is used, the hole pattern may not be distorted nor tilted even when each of the fifth openings 825H has a relatively high aspect ratio, and consequently, reliability and productivity with respect to the memory device may be improved.

Figure 8:
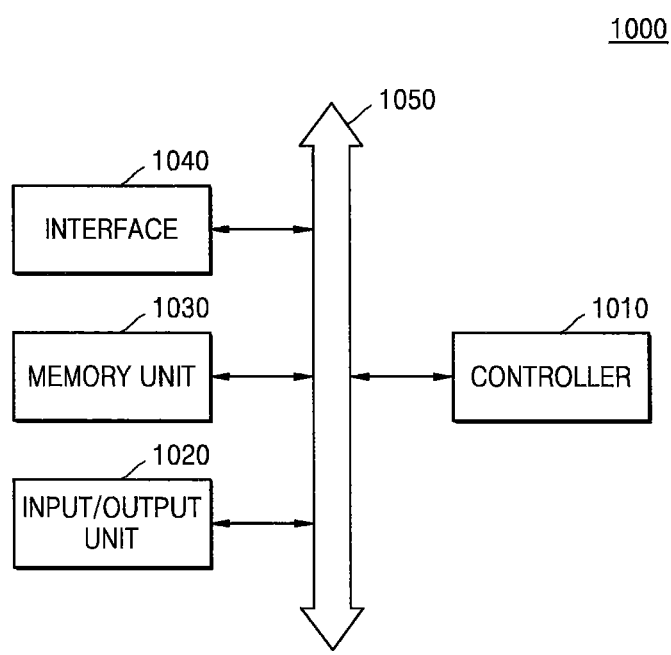
FIG. 8 is a block diagram illustrating a configuration of a system including a semiconductor device manufactured by using a method of manufacturing a semiconductor device, according to some embodiments of the inventive concept.

FIG. 8 is a block diagram illustrating a configuration of a system 1000 including a semiconductor device manufactured by using method of manufacturing a semiconductor device, according to some embodiments of the inventive concept.

Referring to FIG. 8, the system 1000 includes a controller 1010, an input/output unit 1020, a memory unit 1030, an interface 1040, and a bus 1050.

The system 1000 may be a mobile system or a system that transmits or receives information. In some embodiments, the mobile system may be a portable computer, a web tablet, a mobile phone, a digital music player, or a memory card.

The controller 1010 is configured to control an executable program in the system 1000, and may include a microprocessor, a digital signal processor, a microcontroller, or other similar devices.

The input/output unit 1020 may be used to input or output data of the system 1000. The system 1000 may be connected to an external device, such as a personal computer or a network by using the input/output unit 1020, and may exchange data with the external device. For example, the input/output unit 1020 may be a touch pad, a key board or a display.

The memory unit 1030 may store data for operations of the controller 1010 or may store data processed by the controller 1010. The memory unit 1030 may include the semiconductor device manufactured by using the method of manufacturing a semiconductor device according to the aforementioned one or more embodiments.

The interface 1040 may be a data transmission path between the system 1000 and the external device. The controller 1010, the input/output unit 1020, the memory unit 1030, and the interface 1040 may communicate with each other by using the bus 1050.

While the inventive concept has been particularly shown and described with reference to the accompanying drawings, in which embodiments of the disclosure are shown, it is obvious to one of ordinary skill in the art that the inventive concept may be easily embodied in many different forms without changing the technical concept or essential features of the inventive concept. Thus, it should be understood that the embodiments described herein should be considered in a descriptive sense only and not for purposes of limitation.

What is claimed is:

1. A method of manufacturing a semiconductor device, comprising:
    forming an etch target layer on a substrate;
    forming an amorphous metal layer on the etch target layer, the amorphous metal layer comprising nitrogen between 15 atomic percentage (at %) and 25 at %, wherein defects are formed during the forming of the amorphous metal layer;
    forming an amorphous metal hardmask by patterning the amorphous metal layer; and
    etching the etch target layer by using the amorphous metal hardmask as an etching mask,
    wherein forming the amorphous metal layer comprises applying an alternating current bias of about 150 W to about 400 W to a process chamber in which the amorphous metal layer is formed.

2. The method of claim 1, wherein forming the defects comprises performing an ion bombardment of the amorphous metal layer to prevent crystallization of a metal layer in the process chamber.

3. The method of claim 1, further comprising:
    applying direct current power of about 2 kW to about 5 kW to the process chamber.

4. The method of claim 1, further comprising:
supplying an inert gas and a nitrogen gas having a flow ratio of about 20% to about 50% of the inert gas to the process chamber.

5. The method of claim 4, further comprising:
generating plasma in the process chamber by using the inert gas and the nitrogen gas as a process gas.

6. The method of claim 1, wherein a process temperature in the process chamber ranges from about 75° C. to about 300° C., and a process pressure in the process chamber ranges from 13 mTorr to 20 mTorr.

7. The method of claim 1, wherein, forming the amorphous metal layer comprises:
forming the amorphous metal layer using a sputtering method.

8. The method of claim 7, wherein a target used in the sputtering method comprises a metal that does not comprise nitrogen.

9. The method of claim 1, wherein the amorphous metal layer comprises
at least one of tungsten (W), titanium (Ti), tantalum (Ta), manganese (Mn), molybdenum (Mo), cobalt (Co), copper (Cu), nickel (Ni), iron (Fe), and ruthenium (Ru).

10. A method of manufacturing a semiconductor device, comprising:
forming an etch target layer on a substrate;
leading the substrate into a process chamber of a sputtering device;
applying an alternating current bias and direct current power to the process chamber;
generating plasma by supplying an inert gas and a nitrogen gas to the process chamber;
forming an amorphous metal layer on the etch target layer, the amorphous metal layer comprising nitrogen, wherein defects are generated during the forming of the amorphous metal layer;
discharging the substrate out of the process chamber;
forming an amorphous metal hardmask by patterning the amorphous metal layer; and
etching the etch target layer by using the amorphous metal hardmask as an etching mask.

11. The method of claim 10, wherein the amorphous metal layer comprises nitrogen between about 15 atomic percentage (at %) and about 25 at %.

12. The method of claim 10, wherein forming the amorphous metal layer comprises:
applying the alternating current bias of about 150 W to about 400 W and the direct current power of about 2 kW to about 5 kW to the process chamber;
wherein generating the defects comprises performing an ion bombardment of the amorphous metal layer to prevent crystallization of a metal layer within the process chamber.

13. The method of claim 10, wherein the amorphous metal layer comprises tungsten.

14. The method of claim 13, wherein the amorphous metal layer does not include a covalent bond between the tungsten and nitrogen.

15. A method of manufacturing a metal hardmask, comprising:
forming an amorphous metal layer comprising nitrogen between 14 atomic percentage (at %) and 25 at %, wherein defects are formed during the forming of the amorphous metal layer to prevent crystallization of a metal layer;
forming a photoresist pattern on the amorphous metal layer;
forming an amorphous metal hardmask comprising a plurality of hole patterns, wherein forming the amorphous metal hardmask comprises etching the amorphous metal layer by using the photoresist pattern as an etching mask; and
removing the photoresist pattern.

16. The method of claim 15, wherein forming the amorphous metal layer comprises:
applying an alternating current bias of about 150 W to about 400 W to a process chamber in which the amorphous metal layer is formed, and
applying direct current power of about 2 kW to about 5 kW to the process chamber.

17. The method of claim 15, wherein forming the amorphous metal layer comprises forming the amorphous metal layer using a physical vapor deposition (PVD) method.

18. The method of claim 17, wherein a target used in the PVD method comprises tungsten without nitrogen.

19. The method of claim 15, wherein
the plurality of hole patterns penetrate through the amorphous metal hardmask, and
at least some hole patterns from among the plurality of hole patterns are arranged at regular intervals to have substantially uniform pitches.

* * * * *